United States Patent
Sadaka

(10) Patent No.: US 9,716,164 B2
(45) Date of Patent: Jul. 25, 2017

(54) METHODS OF FORMING III-V SEMICONDUCTOR STRUCTURES USING MULTIPLE SUBSTRATES, AND SEMICONDUCTOR DEVICES FABRICATED USING SUCH METHODS

(71) Applicant: Soitec, Bernin (FR)

(72) Inventor: Mariam Sadaka, Austin, TX (US)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/430,513

(22) PCT Filed: Sep. 3, 2013

(86) PCT No.: PCT/IB2013/001911
§ 371 (c)(1),
(2) Date: Mar. 23, 2015

(87) PCT Pub. No.: WO2014/045090
PCT Pub. Date: Mar. 27, 2014

(65) Prior Publication Data
US 2015/0255591 A1    Sep. 10, 2015

Related U.S. Application Data

(60) Provisional application No. 61/704,860, filed on Sep. 24, 2012.

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0254* (2013.01); *H01L 21/02425* (2013.01);
(Continued)

(58) Field of Classification Search
CPC .................................................. H01L 21/76256
See application file for complete search history.

(56) References Cited

U.S. PATENT DOCUMENTS 6,303,468 B1    10/2001    Aspar et al.
6,335,258 B1    1/2002    Aspar et al.
(Continued)

FOREIGN PATENT DOCUMENTS

EP    2428996 A2    3/2012

OTHER PUBLICATIONS

International Preliminary Report on Patentability for International Application No. PCT/IB2013/001911 dated Mar. 24, 2015, 9 pages.
(Continued)

*Primary Examiner* — Alexander Ghyka
(74) *Attorney, Agent, or Firm* — TraskBritt

(57) ABSTRACT

Methods of forming semiconductor devices include epitaxially growing a III-V base layer over a first substrate in a first deposition chamber. The III-V base layer is transferred from the first substrate to a second substrate, and at least one III-V device layer is epitaxially grown on the III-V base layer in a second deposition chamber separate from the first deposition chamber while the III-V base layer is disposed on the second substrate. The first substrate exhibits an average coefficient of thermal expansion (CTE) closer to an average CTE exhibited by the III-V base layer than an average CTE exhibited by the second substrate. Semiconductor devices may be fabricated using such methods.

7 Claims, 12 Drawing Sheets

(51) Int. Cl.
*H01L 29/205* (2006.01)
*H01L 21/683* (2006.01)
*H01L 29/20* (2006.01)
*H01L 23/36* (2006.01)
*H01L 21/762* (2006.01)
*H01L 29/201* (2006.01)
*H01L 29/66* (2006.01)
*H01L 29/417* (2006.01)
*H01L 23/00* (2006.01)

(52) U.S. Cl.
CPC .... *H01L 21/6835* (2013.01); *H01L 21/76256* (2013.01); *H01L 23/36* (2013.01); *H01L 29/201* (2013.01); *H01L 29/2003* (2013.01); *H01L 29/205* (2013.01); *H01L 29/66462* (2013.01); *H01L 29/7781* (2013.01); *H01L 29/7788* (2013.01); *H01L 24/16* (2013.01); *H01L 24/29* (2013.01); *H01L 24/32* (2013.01); *H01L 24/73* (2013.01); *H01L 29/4175* (2013.01); *H01L 2221/6834* (2013.01); *H01L 2221/68327* (2013.01); *H01L 2224/0401* (2013.01); *H01L 2224/05025* (2013.01); *H01L 2224/131* (2013.01); *H01L 2224/16237* (2013.01); *H01L 2224/293* (2013.01); *H01L 2224/2929* (2013.01); *H01L 2224/29147* (2013.01); *H01L 2224/29184* (2013.01); *H01L 2224/32245* (2013.01); *H01L 2224/73253* (2013.01); *H01L 2224/81191* (2013.01); *H01L 2224/81203* (2013.01); *H01L 2224/81815* (2013.01); *H01L 2224/83851* (2013.01); *H01L 2224/83895* (2013.01); *H01L 2924/1461* (2013.01)

(56) References Cited

U.S. PATENT DOCUMENTS

| | | |
|---|---|---|
| 6,756,286 B1 | 6/2004 | Moriceau et al. |
| 6,809,044 B1 | 10/2004 | Aspar et al. |
| 6,946,365 B2 | 9/2005 | Aspar et al. |
| RE39,484 E | 2/2007 | Bruel |
| 7,611,937 B2 | 11/2009 | Lin et al. |
| 7,732,301 B1 | 6/2010 | Pinnington |
| 7,759,699 B2 | 7/2010 | Beach |
| 8,058,158 B2 | 11/2011 | Bourdelle et al. |
| 2006/0255341 A1* | 11/2006 | Pinnington ............ B82Y 20/00 257/79 |
| 2006/0292834 A1 | 12/2006 | Lin et al. |
| 2007/0145417 A1 | 6/2007 | Brar et al. |
| 2009/0004475 A1 | 1/2009 | Sadaka et al. |
| 2010/0061877 A1 | 3/2010 | Sadaka et al. |
| 2010/0289113 A1 | 11/2010 | Bourdelle et al. |
| 2011/0198667 A1* | 8/2011 | Lee .................. C23C 16/45563 257/103 |
| 2012/0013012 A1 | 1/2012 | Sadaka et al. |
| 2012/0013013 A1 | 1/2012 | Sadaka et al. |
| 2012/0061794 A1 | 3/2012 | Sadaka |

OTHER PUBLICATIONS

International Written Opinion for International Application No. PCT/IB2013/001911 dated Mar. 24, 2015, 8 pages.
Aucoin, L., HEMTs and pHEMTs, (1991), pp. 39-43.
International Search Report for International Application No. PCT/IB2013/001911 dated Jan. 21, 2014, 4 pages.
Mishra et al., ALGaN/GaN HEMTs—an overview of device operation and applications, Proceedings of the IEEE, vol. 90, Issue 6,(Jun. 2002), pp. 1022-1031.
Ryu et al., Thin-Body N-Face GaN Transistor Fabricated by Direct Wafer Bonding, IEEE Electron Device Letters, vol. 32, No. 7, (Jul. 2011, pp. 895-897US.
Sadaka et al., Novel GaAs Switch for Compact and Efficient Power Conversion, CS MANTECH Conference, Chicago, IL, (Apr. 14-17, 2008), 4 pages.
Stutzmann et al., Playing with Polarity, PHys. Stat. Sol. (b), vol. 228, No. 2, (2001), ppl 505-512.
Sugimoto et al., Vertical device operation of AlGaN/GaN HEMTs on free standing n GaN substrates, Power Conversion Conference, Nagoya 2007, IEEE, (Apr. 25, 2007), pp. 368-372.

* cited by examiner

METHODS OF FORMING III-V SEMICONDUCTOR STRUCTURES USING MULTIPLE SUBSTRATES, AND SEMICONDUCTOR DEVICES FABRICATED USING SUCH METHODS

CROSS-REFERENCE TO RELATED APPLICATIONS

This application is a national phase entry under 35 U.S.C. §371 of International Patent Application PCT/IB2013/001911, filed Sep. 3, 2013, designating the United States of America and published in English as International Patent Publication WO 2014/045090 A1 on Mar. 27, 2014, which claims the benefit under Article 8 of the Patent Cooperation Treaty and under 35 U.S.C. §119(e) to U.S. Provisional Patent Application Ser. No. 61/704,860, filed Sep. 24, 2012, the disclosure of each of which is hereby incorporated herein in its entirety by this reference.

TECHNICAL FIELD

The present disclosure relates to methods of manufacturing semiconductor structures including III-V semiconductor transistors, to semiconductor structures and electronic devices formed by such methods.

BACKGROUND

Semiconductor structures are structures that are used or formed in the fabrication of semiconductor devices. Semiconductor devices include, for example, electronic signal processors, electronic memory devices, photoactive devices, and microelectromechanical system (MEMS) devices. Such structures and materials often include one or more semiconductor materials (e.g., silicon, germanium, a III-V semiconductor material, etc.), and may include at least a portion of an integrated circuit.

Such semiconductor structures are often fabricated on substrates that include one or more layers of semiconductor material. The semiconductor structures are conventionally fabricated in a layer-by-layer manner (i.e., lithographically) on and/or in a surface of a substrate.

Historically, a majority of such substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is generally used to form active devices on the silicon wafer.

So-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively thicker host or base substrate to facilitate handling of the overall engineered substrate by manufacturing equipment.

A wide variety of engineered substrates are known in the art and may include semiconductor materials such as, for example, silicon (Si), silicon carbide (SiC), germanium (Ge), diamond, III-V semiconductor materials, and II-VI semiconductor materials.

For example, an engineered substrate may include an epitaxial layer of III-V semiconductor material formed on a surface of a base substrate, such as, for example, aluminum oxide ($Al_2O_3$) (which may be referred to as "sapphire"). The epitaxial layer may be formed on the surface of the base substrate by a transfer process from a donor structure, for example, a donor substrate or donor ingot. The transfer from a donor structure may be desirable when the donor material is highly valuable or in scarce supply. Using such an engineered substrate, additional layers of material may be formed and processed (e.g., patterned) over the epitaxial layer of III-V semiconductor material to form one or more devices on the engineered substrate. However, the Coefficient of Thermal Expansion (CTE) mismatch (or difference) between the epitaxial layer and the base substrate comprising the engineered substrate, may influence the formation and processing of the additional layers of material. For example, if the CTE mismatch between the epitaxial layer and the base substrate is substantial, then the engineered substrate may be negatively impacted during the formation of additional layers of materials.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of forming semiconductor devices. A III-V base layer is epitaxially grown over a surface of a first substrate in a first deposition chamber. The III-V base layer is transferred from the surface of the first substrate to a surface of a second substrate, and at least one III-V device layer is epitaxially grown on an exposed surface of the III-V base layer in a second deposition chamber separate from the first deposition chamber while the III-V base layer is disposed on the second substrate. The first substrate exhibits an average coefficient of thermal expansion (CTE) closer to an average CTE exhibited by the III-V base layer than an average CTE exhibited by the second substrate.

In additional embodiments, the present disclosure includes semiconductor devices that may be formed by methods described herein. For example, semiconductor devices may include a substrate comprising a bulk substrate material including silicon. A III-V base layer is disposed over the substrate, a first III-V device layer is disposed on a surface of the III-V base layer opposite the substrate, and a second III-V device layer is disposed on a surface of the first III-V device layer opposite the III-V base layer. The first III-V device layer has a first material composition, and the second III-V device layer has a second material composition differing from the first material composition so as to define an electron channel of at least one transistor proximate a heterojunction between the first III-V device layer and the second III-V device layer.

DETAILED DESCRIPTION

The illustrations presented herein are not meant to be actual views of any particular semiconductor material, structure, or device, but are merely idealized representations that are used to describe embodiments of the disclosure.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, AlGaN, InGaN, InGaP, InGaNP, GaInNAs, etc.

Figure 1:
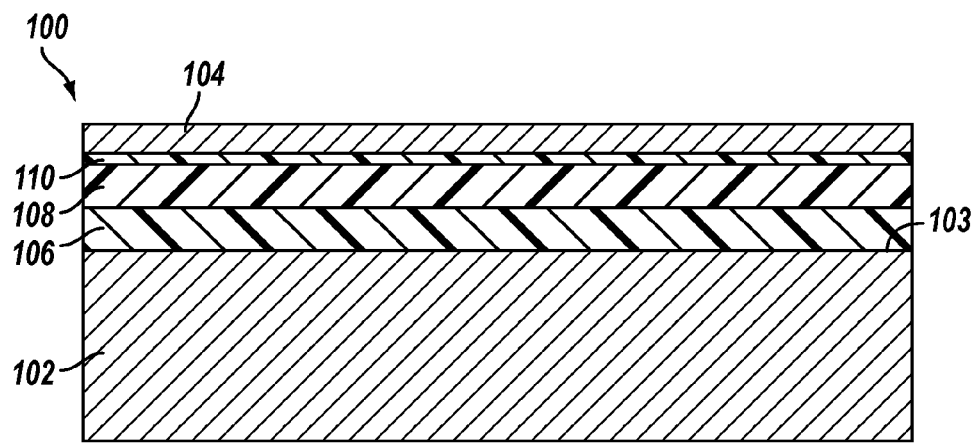
FIG. 1 is a simplified and schematically illustrated cross-sectional view of a first substrate over which a III-V base layer may be epitaxially grown.

FIG. 1 illustrates a substrate 100. The substrate 100 includes a bulk substrate material 102 that exhibits an average coefficient of thermal expansion (CTE) that is close to an average CTE of a III-V semiconductor material of a base layer to be grown over the substrate 100 as described below with reference to FIG. 2. (As used herein, the term "average CTE" means an average CTE at 500° C.) For example, a bulk substrate material 102 may be selected such that the average CTE of a III-V semiconductor material of a base layer to be grown over the substrate 100 is within about 20% or less, or even 10% or less, of the average CTE exhibited by the bulk substrate material 102. Many III-V semiconductor materials exhibit an average CTE in the range extending from about $4.0 \times 10^{-6}$/K to about $8 \times 10^{-6}$/K. GaN may exhibit an average CTE in a range extending from about $5.2 \times 10^{-6}$/K to about $6.8 \times 10^{-6}$/K. Molybdenum is known to exhibit an average CTE of about $5.8 \times 10^{-6}$/K. Thus, for example, the bulk substrate material 102 may be selected to comprise metallic molybdenum or a molybdenum-based metallic alloy in embodiments in which the III-V semiconductor material to be grown over the substrate 100 is to comprise GaN. Substrates that include metallic molybdenum or molybdenum-based metallic alloys that may be employed in accordance with embodiments of the present disclosure are disclosed in, for example, U.S. Pat. No. 7,732,301 to Pinnington et al., the entire disclosure of which is incorporated herein in its entirety by this reference. As a specific non-limiting example, for GaN that exhibits an average CTE of about $6.0 \times 10^{-6}$/K to be epitaxially grown over the substrate 100, the bulk substrate material 102 of the substrate 100 may be selected to comprise a molybdenum-based metallic material that exhibits an average CTE of about $5.8 \times 10^{-6}$/K, since $6.0 \times 10^{-6}$ is within about 20% of $5.8 \times 10^{-6}$ (i.e., about 3.5%). In other embodiments, the bulk substrate material 102 may be selected to comprise the same III-V semiconductor material that is to be grown over the substrate 100. For example, if GaN is to be grown over the bulk substrate material 102, the bulk substrate material 102 may comprise freestanding GaN. Such an embodiment may enable a high quality GaN material to be grown over the bulk substrate material 102. However, freestanding GaN is generally expensive to obtain. Molybdenum is less expensive to obtain than freestanding GaN, yet molybdenum still enables the formation of a GaN film having only slightly lower quality than a GaN film formed over freestanding GaN. Therefore, in some embodiments, a balance between cost and performance may lead to a selection of the bulk substrate material 102 to comprise a molybdenum-based metallic material, as described herein. Of course, any of freestanding GaN, a molybdenum-based metallic material, and other materials may be selected for the bulk substrate material 102 depending on the cost, performance, or other characteristics required for a given application.

Other materials may be employed for the bulk substrate material 102, as long as the average CTE of the III-V material to be epitaxially grown over the substrate 100 is within about 20% of the average CTE exhibited by the bulk substrate material 102, and the material is stable throughout the range of temperatures to which the material will be subjected in processing and will not adversely react with, degrade, or contaminate the III-V material to be epitaxially grown over the substrate 100.

As shown in FIG. 1, the substrate 100 optionally may include one or more additional materials over a major surface 103 of the bulk substrate material 102. For example, the substrate 100 may comprise a multi-layer substrate that also includes a seed layer 104 over the major surface 103 of the bulk substrate material 102. The seed layer 104 may comprise a layer of III-V semiconductor material, on which a relatively thicker III-V base layer may be epitaxially grown, as described further below with reference to FIG. 2. The seed layer 104 may have a relatively thin average layer thickness. For example, the seed layer 104 may have an average layer thickness in a range extending from about 0.1 nm to about 200 nm.

As is also shown in FIG. 1, one or more intermediate layers of material may be disposed between the seed layer 104 and the bulk substrate material 102. For example, a first oxide layer 106 may be disposed on the major surface 103 of the bulk substrate material 102, a second oxide layer 108 may be disposed on the first oxide layer 106 on a side thereof opposite the bulk substrate material 102, a nitride layer 110 may be disposed on the second oxide layer 108 on a side thereof opposite the first oxide layer 106, and the seed layer 104 may be disposed on the nitride layer 110 on a side thereof opposite the second oxide layer 108.

In some embodiments, the seed layer 104 may be transferred to the bulk substrate material 102 from a donor structure, and the intermediate layers (first oxide layer 106, second oxide layer 108, and nitride layer 110) may be used to facilitate bonding of the seed layer 104 to the major surface 103 of the bulk substrate material 102.

By way of example and not limitation, the process known in the art as the SMARTCUT® process may be used to transfer the seed layer 104 from a donor structure to the bulk substrate material 102. The SMARTCUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosure of each of which is hereby incorporated herein in its entirety by this reference.

In the SMARTCUT® process, a plurality of ions (e.g., one or more of hydrogen, helium, or inert gas ions) may be implanted into a donor structure along an ion implant plane. The donor structure may comprise a bulk crystalline III-V semiconductor material, such as monocrystalline GaN. The implanted ions along the ion implant plane define a plane of weakness within the donor structure, along which the donor structure subsequently may be cleaved or otherwise fractured. As known in the art, the depth at which the ions are implanted into the donor structure is at least partially a function of the energy with which the ions are implanted into the donor structure. Generally, ions implanted with less energy will be implanted at relatively shallower depths, while ions implanted with higher energy will be implanted at relatively deeper depths. The donor structure is bonded to bulk substrate material 102. A direct atomic bonding process may be used to bond the donor structure to the bulk substrate material 102. In such embodiments, the intermediate layers (first oxide layer 106, second oxide layer 108, and nitride layer 110) may comprise layers used as part of the atomic bonding process. For example, the second oxide layer 108 and the nitride layer 110 may be formed on the donor structure, and the first oxide layer 106 may be formed on the bulk substrate material 102, after which the first oxide layer 106 may be directly atomically bonded to the second oxide layer 108 in a direct oxide-oxide bonding process.

After the bonding process, the bonded donor structure may be cleaved or otherwise fractured along the ion implant plane. For example, the donor structure (with the bulk substrate material 102 bonded thereto) may be heated to cause the donor structure to fracture along the ion implant plane. Optionally, mechanical forces may be applied to the donor structure to assist in the cleaving of the donor structure along the ion implant plane. After the donor structure has been cleaved or otherwise fractured along the ion implant plane, a portion of the donor structure remains bonded to the bulk substrate material 102, which portion defines the seed layer 104. A remainder of the donor structure may be reused in further SMARTCUT® processes to transfer additional portions of the donor structure to other recipient structures. After the fracturing process, the exposed major surface of the seed layer comprises a fractured surface of the donor structure, and may include ion impurities and imperfections in the crystal lattice of the seed layer 104, which, in some applications, may comprise a single crystal of semiconductor material (e.g., monocrystalline GaN, InN, AlN, or alloys thereof). The seed layer 104 may be treated in an effort to reduce impurity levels and improve the quality of the crystal lattice (i.e., reduce the number of defects in the crystal lattice proximate the exposed major surface) in the seed layer 104. Such treatments may involve one or more of grinding, polishing, etching, and thermal annealing.

Figure 2:
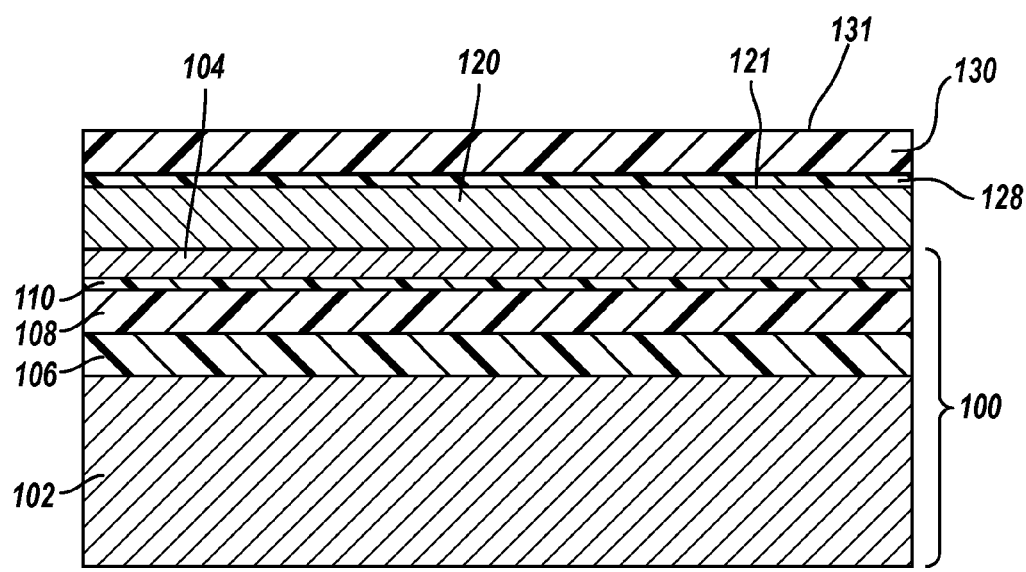
FIG. 2 is a simplified and schematically illustrated cross-sectional view illustrating a III-V base layer epitaxially grown over the first substrate of FIG. 1.

Referring to FIG. 2, a III-V base layer 120 may be epitaxially grown over a surface of the substrate 100. The III-V base layer 120 may be selected to comprise, for example, a binary III-V semiconductor material, such as AlN, AlP, AlAs, GaN, GaP, GaAs, InN, InP, InAs, or alloys thereof. In some embodiments, the III-V base layer 120 may comprise a III-nitride material, such as AlN, GaN, InN, or alloys thereof (e.g., InGaN).

As shown in FIG. 2, the III-V base layer 120 may be epitaxially grown on an exposed surface of the seed layer 104 in some embodiments. Although a boundary is illustrated in FIG. 2 between the seed layer 104 and the III-V base layer 120, there may not be any identifiable boundary between the seed layer 104 and the III-V base layer 120 in embodiments in which the seed layer 104 and the III-V base layer 120 have the same composition.

Various processes known in the art may be used to epitaxially grow the III-V base layer 120 over the substrate 100. Such processes include, but are not limited to, chemical vapor deposition (CVD), metallorganic chemical vapor deposition (MOCVD), vapor phase epitaxy (VPE), hydride vapor phase epitaxy (HVPE), molecular beam epitaxy (MBE), and atomic layer deposition (ALD).

The III-V base layer 120 may be grown to have an average layer thickness in a range extending from about 100 nm to about 10 microns or more.

In some embodiments, the III-V base layer 120 may comprise a non-polar material or a semi-polar material. In some embodiments, the III-V base layer 120 may comprise a polar material, and the III-V base layer 120 may be grown such that an exposed major surface 121 of the III-V base layer 120 has a selected polarity. For example, the III-V base layer 120 may be grown such that the exposed major surface 121 of the III-V base layer 120 has a Group III face. In other words, the exposed major surface 121 of the III-V base layer 120 may be at least substantially comprised by Group III atoms. As a non-limiting example, the III-V base layer 120 may comprise GaN, and the exposed major surface 121 of the III-V base layer 120 may comprise what is referred to in the art as a "Ga-face" of the crystal structure. In other words, the exposed major surface 121 of the III-V base layer 120 may be at least substantially comprised by Ga atoms.

After epitaxially growing the III-V base layer 120 over a surface of the substrate 100, a first dielectric layer 128 may be disposed (e.g., formed, deposited) on the exposed major surface 121 of the III-V base layer 12. By way of non-limiting example, the first dielectric layer 128 may comprise a nitride material used to passivate (i.e., protect from environmental and chemical damage) the major surface 121 of the III-V base layer. A second dielectric layer 130 may be disposed (e.g., formed, deposited) on a side of the first dielectric layer 128 opposite the III-V base layer 120 such that the second dielectric layer 130 has an exposed major surface 131, as shown in FIG. 2. By way of non-limiting example, the second dielectric layer 130 may comprise an oxide material that will be used to form an oxide-oxide bond with a second substrate when transferring the III-V base layer 120 to the second substrate, as explained in more detail below.

Figure 3:
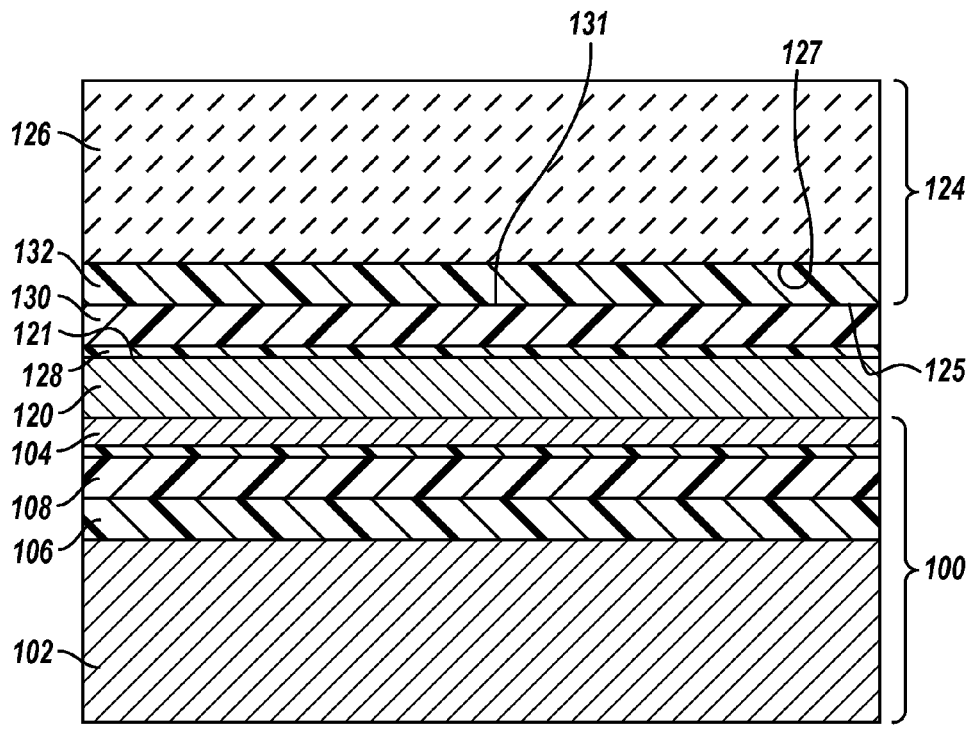
FIG. 3 is a simplified and schematically illustrated cross-sectional view illustrating a second substrate bonded to the III-V base layer of FIG. 2 on a side thereof opposite the first substrate.

The III-V base layer 120 may be transferred from the surface of the substrate 100 to a surface of a second substrate 124, as described below with reference to FIGS. 3 and 4. As shown in FIG. 3, the surface 131 of the second dielectric layer 130 formed over the III-V base layer 120 may be bonded to a bonding surface 125 of the second substrate 124.

As shown in FIG. 3, the second substrate 124 includes a bulk substrate material 126. The bulk substrate material 126 may exhibit an average CTE that is similar to, or that differs from, an average CTE of the III-V semiconductor material of the III-V base layer 120 and an average CTE of the bulk substrate material 102 of the first substrate 100. In some embodiments, the bulk substrate material 126 may be selected to comprise a material that facilitates subsequent processing and/or handling of the second substrate 124 by processing equipment. As a non-limiting example, the bulk substrate material 126 may comprise silicon. In some embodiments, the bulk substrate material 126 may comprise monocrystalline silicon. In other embodiments, the bulk substrate material 126 may comprise polycrystalline silicon. In yet other embodiments, the bulk substrate material 126 may comprise diamond, a diamond-like material, or silicon carbide (e.g., monocrystalline SiC or polycrystalline SiC). Other materials may be employed for the bulk substrate material 126, such as ceramic materials (e.g., oxides, nitrides, carbides) or semiconductor materials (e.g., silicon, germanium, etc.). As a non-limiting example, the bulk substrate material 126 may comprise a material that is substantially free of contaminants that would, if present, introduce unwanted dopants or contaminants into a semiconductor processing facility utilized for the manufacture of integrated circuits.

As shown in FIG. 3, the second substrate 124 optionally may also include one or more additional materials over a major surface 127 of the bulk substrate material 126 (although the second substrate 124 is inverted in the perspective of FIG. 3 and shown as bonded to the III-V base layer 120). For example, the substrate 124 may comprise a third dielectric layer 132 disposed on the major surface 127 of the bulk substrate material 126. The third dielectric layer 132 may comprise an oxide material to facilitate the formation of an oxide-oxide bond between the third dielectric layer 132 and the second dielectric layer 130 formed over the III-V base layer 120, to bond the III-V base layer 120 to the second substrate 124, as described below.

With continued reference to FIG. 3, the second substrate 124 may be bonded to the major surface 131 of the second dielectric layer 130 using any of a number of bonding processes. In some embodiments, a direct atomic bonding process may be employed to bond the second substrate 124 to the exposed major surface 131 of the second dielectric layer 130 without using an adhesive therebetween. The direct bonding operation may form direct atomic bonds between the bonding surface 125 of the second substrate 124 and the bonding surface 131 of the second dielectric layer 130. The nature of the atomic bonds between the second substrate 124 and the second dielectric layer 130 will depend upon the material compositions at the bonding surfaces of each of the second substrate 124 and the second dielectric layer 130. In embodiments wherein the second and third dielectric layers 130, 132 are both formed of an oxide material, the bonding may be characterized by oxide-oxide bonds, which may exhibit a generally stronger bonding strength than oxide-nitride bonds or nitride-nitride bonds. Thus, forming each of the second and third dielectric layers 130, 132 to comprise an oxide material may enable the formation of a relatively strong bond between the second substrate 124 and the III-V base layer 130.

In some embodiments, the direct bond between the bonding surface 125 of the second substrate 124 and the bonding surface 131 of the second dielectric layer 130 may be established by forming each of the bonding surface 125 of the second substrate 124 and the bonding surface 131 of the second dielectric layer 130 to have relatively smooth surfaces, and subsequently abutting the bonding surfaces together and initiating propagation of a bonding wave therebetween. For example, each of the bonding surface 125 of the second substrate 124 and the bonding surface 131 of the second dielectric layer 130 may be formed to have a root mean square surface roughness ($R_{RMS}$) of about two nanometers (2.0 nm) or less, about one nanometer (1.0 nm) or less, or even about one-fourth of a nanometer (0.25 nm) or less. Each of the bonding surface 125 of the second substrate 124 and the bonding surface 131 of the second dielectric layer 130 may be smoothed using at least one of a mechanical polishing operation and a chemical etching operation. For example, a chemical-mechanical polishing (CMP) operation may be used to planarize and/or reduce the surface roughness of each of the bonding surface 125 of the second substrate 124 and the bonding surface 131 of the second dielectric layer 130.

After smoothing the bonding surfaces 125, 131, the bonding surfaces 125, 131 optionally may be cleaned and/or activated using processes known in the art. Such an activation process may be used to alter the surface chemistry at the bonding surfaces 125, 131 in a manner that facilitates the bonding process and/or results in the formation of a stronger bond.

The bonding surfaces 125, 131 may be brought into direct physical contact with one another, and pressure may be applied in a localized area across the bonding interface. Inter-atomic bonds may be initiated in the vicinity of the localized pressure area, and a bonding wave may propagate across the interface between the bonding surfaces.

Optionally, an annealing process may be used to strengthen the bond. Such an annealing process may comprise heating the bonded structure in a furnace at a temperature of between about one hundred degrees Celsius (100° C.) and about four hundred degrees Celsius (400° C.) for a time of between about two minutes (2 min) and about one hundred hours (100 hrs.).

In some embodiments, a direct bond between the second substrate 124 and the III-V base layer 120 may be accomplished through a bonding material being formed on the bonding surface of one or both of the second substrate 124 and the second dielectric layer 130. In such embodiments, the interface between the second substrate 124 and the second dielectric layer 130 may include atomic bonds between the second substrate 124 and the bonding material and atomic bonds between the bonding material and the second dielectric layer 130. In some embodiments, the bonds may be characterized by oxide-oxide bonds.

Figure 4:
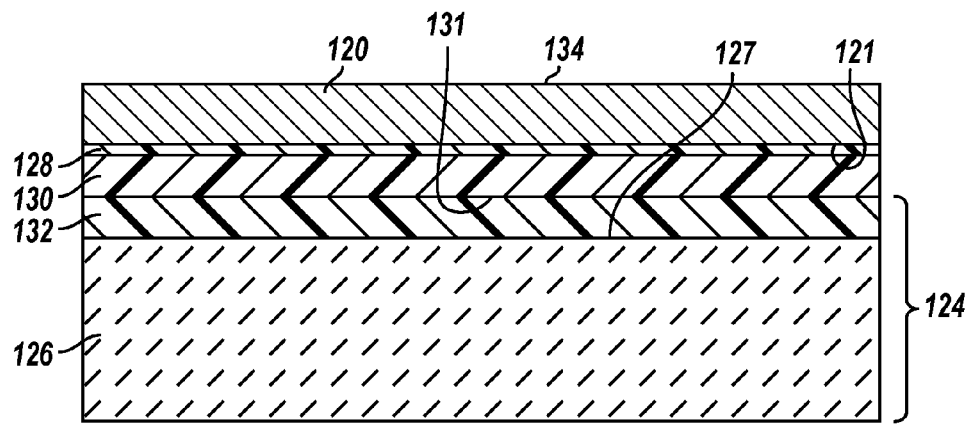
FIG. 4 is a simplified and schematically illustrated cross-sectional view illustrating a semiconductor structure formed by removing the first substrate from the structure of FIG. 3.

Referring to FIGS. 3 and 4, after bonding the second substrate 124 to the III-V base layer 120, the first substrate 100 may be removed from the III-V base layer 120, which remains bonded to the second substrate 124, to complete transfer of the III-V base layer 120 to the second substrate 124. The first substrate 100 may be removed from the III-V base layer 120 using one or more of a grinding process, a polishing process (e.g., a chemical-mechanical polishing (CMP) process), and a selective etching process.

After removing the first substrate 100, an exposed major surface 134 of the III-V base layer 120 may include impurities and/or imperfections in the crystal lattice of the III-V base layer 120, which, in some applications, may comprise a single crystal of semiconductor material (i.e., monocrystalline GaN). The III-V base layer 120 may be treated in an effort to reduce impurity levels and improve the quality of the crystal lattice (i.e., reduce the number of defects in the crystal lattice proximate the exposed major surface 134) in the III-V base layer 120. Such treatments may involve one or more of grinding, polishing, etching, and thermal annealing.

As previously mentioned, the III-V base layer 120 may comprise a polar material, such as GaN, and the surface 121 of the III-V base layer 120 to which the second substrate 124 is attached may comprise a Group III face of the crystal structure, such as a Ga-face of the crystal structure of GaN. Thus, upon removing the first substrate 100 from the III-V base layer 120, the exposed major surface 134 of the III-V base layer 120 may comprise a Group V face of the crystal structure, such as the N-face of the crystal structure of the GaN. In the case of GaN, epitaxial growth rates are generally higher when growing GaN on the Ga-face of the crystal structure compared to on the N-face of the crystal structure. Thus, efficient epitaxial growth of relatively thicker GaN layers, such as the III-V base layer 120, is generally started from the Ga-face of an underlying layer, such as the exposed surface of the seed layer 104 shown in FIG. 1. On the other hand, relatively thin GaN layers, such as first and second III-V device layers 140, 150 described below with reference to FIG. 5, may be grown starting from the N-face of an underlying layer, such as the major surface 134 the III-V base layer 120. In other words, processing efficiency may improve if thicker layers of III-V semiconductor material are grown on the Ga-face of an underlying seed layer and thinner layers of III-V semiconductor material are grown on the N-face of an underlying seed material. In other embodiments, however, the surface 121 of the III-V base layer 120 may comprise the Group V face of the crystal structure (e.g., the N-face of the crystal structure of GaN), and the surface 134 of the III-V base layer 120 may comprise the Group III face of the crystal structure (e.g., the Ga-face of the crystal structure of GaN).

After transferring the III-V base layer 120 to the second substrate 124 as described above with reference to FIGS. 3 and 4, III-V device layers may be formed over the exposed major surface 134 of the III-V base layer 120. The III-V device layers may be used to form at least a portion of an electron channel for one or more transistors.

Figure 5:
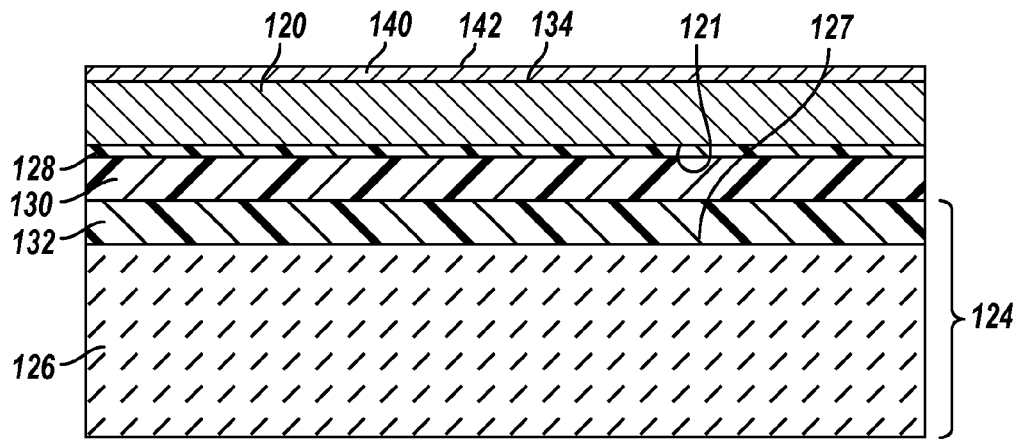
FIG. 5 is a simplified and schematically illustrated cross-sectional view illustrating a semiconductor structure formed by growing a first III-V device layer on an exposed surface of the III-V base layer of the semiconductor structure of FIG. 4.
Figure 6:
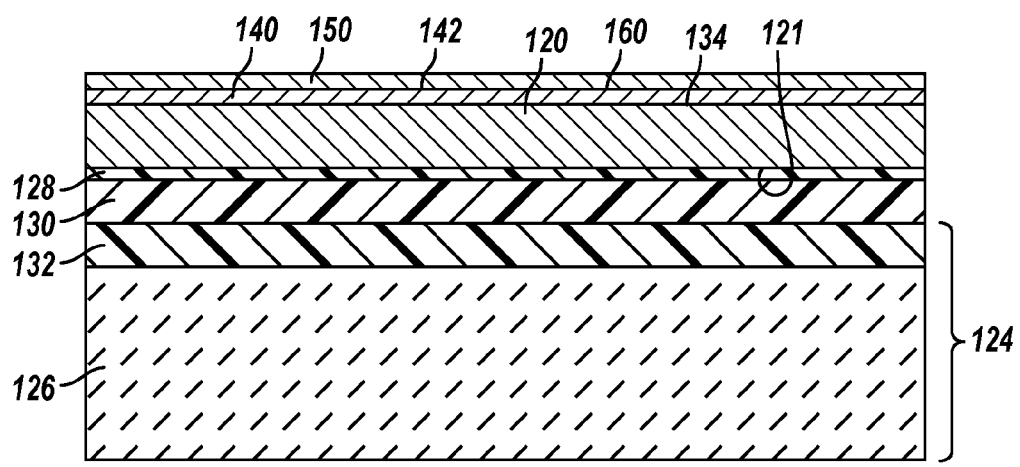
FIG. 6 is a simplified and schematically illustrated cross-sectional view illustrating a semiconductor structure formed by growing a second III-V device layer on the first III-V device layer of FIG. 5.

As shown in FIG. 5, a first III-V device layer 140 may be epitaxially grown on an exposed surface 134 of the III-V base layer 120, after which a second III-V device layer 150 may be epitaxially grown on a surface 142 of the first III-V device layer 140, as shown in FIG. 6. The first III-V device layer 140 may be epitaxially grown on the exposed surface 134 of the III-V base layer 120 while the III-V base layer 120 is disposed on the second substrate 124. Similarly, the second III-V device layer 150 may be epitaxially grown on the first III-V device layer 140, while the first III-V device layer 140 and the III-V base layer 120 are disposed over the second substrate 124.

In some embodiments, the III-V base layer 120 may be epitaxially grown as previously described in relation to FIG. 2 in a first deposition chamber, and the first III-V device layer 140 and the second III-V device layer 150 may be epitaxially grown in a different, second deposition chamber. For example, the III-V base layer 120 may be epitaxially grown in one HYPE or MOCVD deposition chamber over the first substrate 100, and the first III-V device layer 140 and the second III-V device layer 150 may be epitaxially grown on the III-V base layer 120 over the second substrate 124 in a separate HYPE or MOVCD deposition chamber. In this manner, the III-V base layer 120 may be epitaxially grown over the bulk substrate material 102 of the first substrate 100, which may comprise a material, such as molybdenum, selected to exhibit a closely matched CTE to the CTE of the III-V base layer 120, which may comprise GaN. After forming the III-V base layer 120 over the CTE-matched first substrate 100 in a first deposition chamber, the III-V base layer 120 may be transferred to the second substrate 124, which may comprise a material that will not impart excessive levels of impurities into a semiconductor processing facility utilized for the manufacture of integrated circuits as the III-V device layers 140, 150 are grown over the III-V base layer 120 on the bulk substrate material 126, which may, in the case of silicon, be more compatible with the manufacture of other silicon integrated circuits to be formed in the same semiconductor processing facility.

Figure 18:
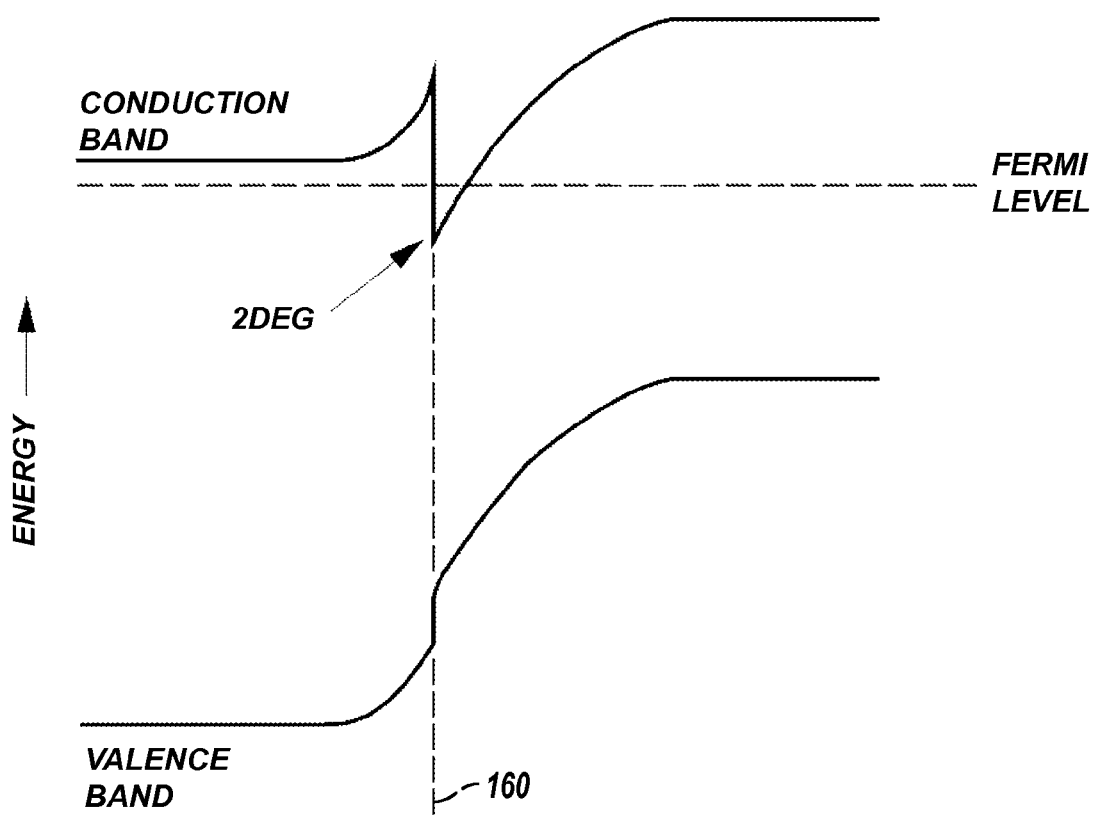
FIG. 18 is a simplified and schematically illustrated generic energy band diagram of a heterojunction between active III-V device layers of an HEMT as described herein.

The first III-V device layer 140 may be formed to have a first material composition, and the second III-V device layer 150 may be formed to have a second material composition that differs from the first material composition of the first III-V device layer 140. The compositions of the first III-V device layer 140 and the second III-V device layer 150 may be selected so as to define an electron channel of a transistor proximate a heterojunction 160 between the first III-V device layer 140 and the second III-V device layer 150. In particular, the material composition of the first III-V device layer 140 may be selected to exhibit a first energy bandgap, and the material composition of the second III-V device layer 150 may be selected to exhibit a second energy bandgap differing from the first energy bandgap of the first III-V device layer 140. FIG. 18 is a simplified and schematically illustrated generic energy band diagram of a heterojunction 160 according to some embodiments of the present disclosure. The first energy bandgap between the valence band and the conduction band in the first III-V device layer 140 is illustrated on the left-hand side of the heterojunction 160, and the second energy bandgap between the valence band and the conduction band in the second III-V device layer 150 is illustrated on the right-hand side of the heterojunction 160. The compositions of the first III-V device layer 140 and the second III-V device layer 150 may be further selected such that the conduction band in the energy band structure within the first III-V device layer 140 and the second III-V device layer 150 extends below a Fermi energy level proximate the heterojunction 160, and such that a two-dimensional (2D) electron gas (2DEG) is defined in at least one of the first III-V device layer 140 and the second III-V device layer 150 proximate the heterojunction 160, as shown in FIG. 18. The phrase "electron gas" is used in the art and in the present disclosure to describe an area or volume of electrons that are highly mobile. As known in the art, electron mobility may be relatively high within the 2D electron gas proximate the heterojunction 160.

Referring again to FIG. 6, in some embodiments, the first III-V device layer 140 may comprise a ternary III-V semiconductor material, such as a ternary III-V semiconductor material selected from the group consisting of AlGaN, InGaN, AlInN, AlGaP, GaInP, AlInP, AlGaAs, GaInAs, and AlInAs. The second III-V device layer 150 may comprise a binary III-V semiconductor material, such as a binary III-V semiconductor material selected from the group consisting of AlN, AlP, AlAs, GaN, GaP, GaAs, InN, InP, and InAs. In one particular, non-limiting example embodiment, the III-V base layer 120 may comprise a first binary III-V semiconductor material such as GaN, the first III-V device layer 140 may comprise a ternary III-V semiconductor material such as AlGaN, and the second III-V device layer 150 may comprise a second binary III-V semiconductor material such as GaN. In such embodiments, the 2D electron gas (FIG. 18) may be defined in the second III-V device layer 150 adjacent the heterojunction 160. The first III-V device layer 140 and the second III-V device layer 150 may each have an average layer thickness in a range extending from about 2 nm to about 150 nm.

At least a portion of the first III-V device layer 140 may be doped n-type in some embodiments. For example, III-V semiconductor materials such as GaN and AlGaN may be doped with one or more of silicon and germanium ions to render the III-V semiconductor materials n-type. At least a portion of the second III-V device layer 150 may be undoped, although a portion of the second layer 150 may be doped p-type in some embodiments. For example, III-V semiconductor materials such as GaN and AlGaN may be doped with one or more of carbon, magnesium, and zinc ions to render the III-V semiconductor materials p-type. The 2D electron gas may result from such doping of the III-V device layers 140, 150 and/or from an electrical field present at the heterojunction 160 due to the polarity of the III-V semiconductor materials of the III-V device layers 140, 150.

As previously mentioned, the III-V base layer 120 may comprise a polar material, such as GaN, and the exposed major surface 134 of the III-V base layer 120 may comprise a Group V face of the crystal structure, such as the N-face of the crystal structure of the GaN. Thus, in some embodiments, the first III-V device layer 140 may be epitaxially grown on a Group V face of the polar III-V semiconductor material of the III-V base layer 120.

One or more transistors may be fabricated that use the 2D electron gas defined proximate the heterojunction 160 as at least a portion of a channel region disposed between a source contact and a drain contact. Additionally, a gate structure may be formed or otherwise provided that is configured to selectively modulate current flow through the channel region between the source contact and the drain contact. The transistors may comprise what are referred to in the art as "high electron mobility transistors" (HEMTs), and may be lateral HEMTs or vertical HEMTs. Additionally, the HEMTs may comprise pseudomorphic HEMTs (pHEMTs), wherein a III-V semiconductor material of the first III-V device layer 140 and a III-V semiconductor material of the second III-V device layer 150 (e.g., GaN) have different relaxed lattice parameters, but, due to the fact that the second III-V device layer 150 is epitaxially grown over the first III-V device layer 140 and is sufficiently thin to conform its lattice structure to the lattice structure of the first III-V device layer 140 without a substantial number of defects, the lattice parameter of the III-V semiconductor material of the second III-V device layer 150 matches the lattice parameter of the III-V semiconductor material of the first III-V device layer 140, and a strain balance is attained between the III-V device layers 140, 150.

FIGS. 7 through 10 provide a non-limiting example of a method that may be employed to form a lateral HEMT.

Figure 7:
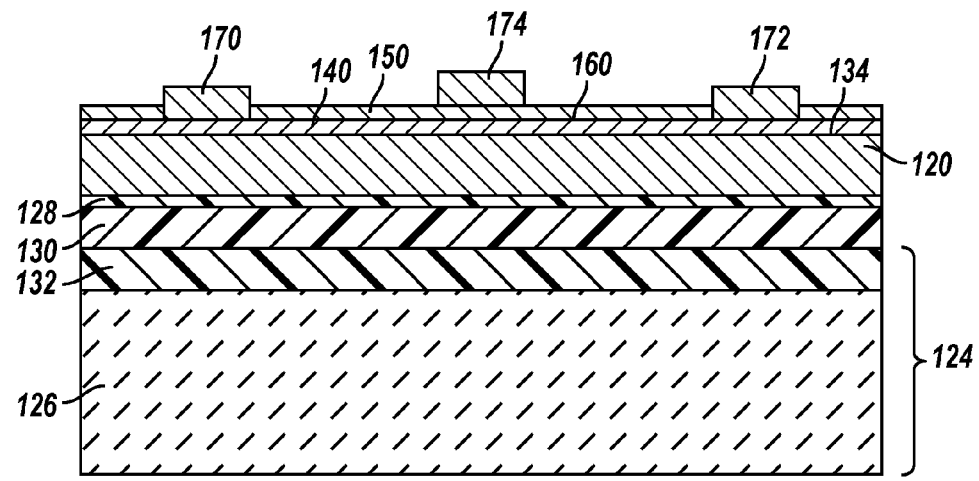
FIG. 7 is a simplified and schematically illustrated cross-sectional view illustrating a source contact, a drain contact, and a gate structure of a lateral high electron mobility (HEMT) transistor formed on the structure of FIG. 6.

Referring to FIG. 7, a source contact 170 and a drain contact 172 of a transistor may be formed or otherwise provided proximate the heterojunction 160. Each of the source contact 170 and the drain contact 172 may be provided in electrical communication with the electron channel defined by the 2D electron gas proximate the heterojunction 160 between the first III-V device layer 140 and the second III-V device layer 150. Further, a gate structure 174 for a transistor may be formed or otherwise provided proximate the electron channel defined by the 2D electron gas proximate the heterojunction 160 between the first III-V device layer 140 and the second III-V device layer 150.

The source contact 170, drain contact 172, and gate structure 174 each may comprise one or more conductive materials, such as a metal (e.g., Au, Ni, Pt, Ge, Al, Cu, Ti, W, or an alloy based on such metals), or a doped semiconductor material. As shown in FIG. 7, each of the source contact 170 and the drain contact 172 may be formed directly over the second III-V device layer 150, and may be disposed in direct physical contact with the second III-V device layer 150. In some embodiments, each of the source contact 170 and the drain contact 172 may extend through at least a portion of the second III-V device layer 150 and may be in direct physical contact with the first III-V device layer 140, so as to ensure electrical contact with the electron channel defined by the 2D electron gas located proximate the heterojunction 160 between the III-V device layers 140, 150. In this configuration, the source contact 170 and the drain contact 172 are disposed laterally beside one another, and electrical current flows laterally through the electron channel defined by the 2D electron gas proximate the heterojunction 160 between the source contact 170 and the drain contact 172.

With continued reference to FIG. 7, the gate structure 174 may be formed vertically over the second III-V device layer 150, and may not be in direct electrical communication with the electron channel defined by the 2D electron gas proximate the heterojunction 160. The gate structure 174 may be disposed sufficiently close to the electron channel, however, such that an electrical field generated by selectively applying a voltage to the gate structure 174 may be used to selectively modulate current flow through the electron channel between the source contact 170 and the drain contact 172. By way of non-limiting example, the gate structure 174 may be disposed between about 10 nm and about 150 nm from the electron channel.

Although FIG. 7 illustrates a single transistor, it is understood that many (e.g., thousands, millions, billions or more) transistors may be fabricated over respective regions of the III-V base layer 120. The processes often employed in the art to fabricate such transistors are often referred to in the art as "front-end-of-line" (FEOL) processes. In such configurations, the electron channel associated with each transistor may be electrically isolated from electron channels associated with adjacent transistors.

Figure 8:
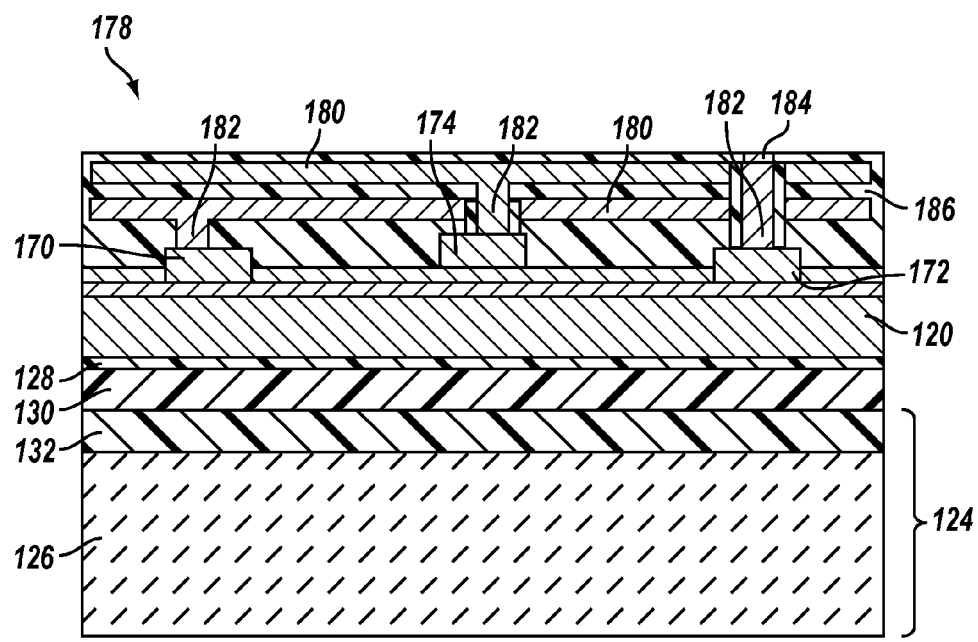
FIG. 8 is a simplified and schematically illustrated cross-sectional view illustrating the formation of conductive features formed over the structure of FIG. 7 for establishing electrical interconnection with the active features of the transistor.

Referring to FIG. 8, after forming the transistors, one or more additional layers of electrically conductive features used to electrically interconnect various features of the transistors (e.g., source contacts 170, drain contacts 172, and gate structures 174 of the transistors) may be formed over the transistors on a side thereof opposite the III-V base layer 120. The conductive features may comprise one or more of laterally extending conductive lines 180 (e.g., traces), vertically extending conductive vias 182, and electrical contact pads 184. The conductive features may comprise electrically conductive material regions (e.g., gold, copper, aluminum, etc.) that are at least partially embedded in a dielectric material 186. The one or more layers of conductive features and surrounding dielectric material 186 may be formed in a layer-by-layer lithographic process over the transistors. In such processes, layers of dielectric material and layers of conductive material may be deposited and selectively patterned in an alternating manner to form the various conductive features and the dielectric material 186. The processes often employed in the art to fabricate these electrically conductive features are often referred to in the art as "back-end-of-line" (BEOL) processes.

The transistors and the conductive features formed over the transistors (e.g., one or more of the conductive lines 180, conductive vias 182, and electrical contact pads 184) may form at least a portion of an integrated circuit. After the FEOL processing and BEOL processing used to form the active layers of the integrated circuit as described above, a structure 178 of FIG. 8 may be configured for attachment to another structure or device for use in a higher level electrical device or system. For example, referring to FIG. 9, bumps or balls 188 of electrically conductive metal or metal alloy optionally may be formed on an exposed major surface on an active side of the structure 178 of FIG. 8 (i.e., the side of the structure on which the transistors are fabricated) to form the structure 187 of FIG. 9. The bumps or balls 188 may be in electrical contact with conductive features of the structure 187, such as the conductive pads 184. The bumps or balls 188 may be used to structurally and electrically couple the structure 187 of FIG. 9 to another structure or device 190, as shown in FIG. 10. Although the structure 187 is shown as including the second substrate 124, in other embodiments, the second substrate 124 may be removed prior to or after the structure 187 is structurally and electrically coupled to another structure or device 190.

By way of example and not limitation, the bumps or balls 188 of electrically conductive material on the structure 187 (FIG. 9) may be structurally and electrically bonded to complementary electrical contacts 192 (e.g., bond pads, etc.) on another structure or device 190. The structure or device 190 may comprise, for example, a higher level substrate, such as a printed circuit board. In some embodiments, the bumps or balls 188 may comprise a solder alloy, and may be structurally and electrically coupled to the electrical contacts 192 using a solder reflow process. In other embodiments, the bumps or balls 188 may comprise a metal or metal alloy having a relatively higher melting point than conventional solder alloys, and may be structurally and electrically coupled to the electrical contacts 192 using a thermocompression bonding process.

Figure 9:
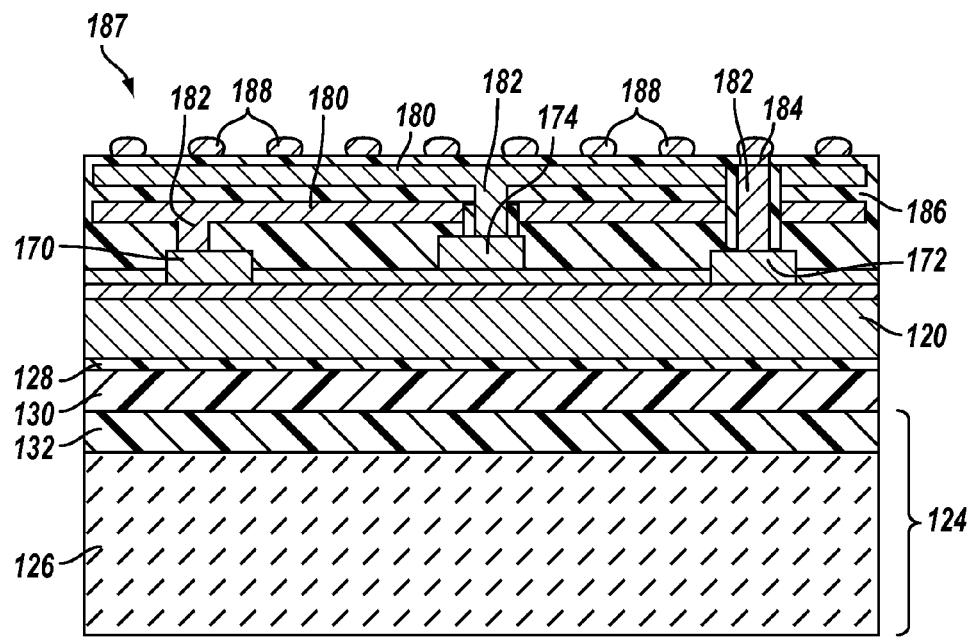
FIG. 9 is a simplified and schematically illustrated cross-sectional view illustrating electrical contacts formed on the structure of FIG. 8 for structurally and electrically connecting the structure of FIG. 8 to another structure or device.
Figure 10:
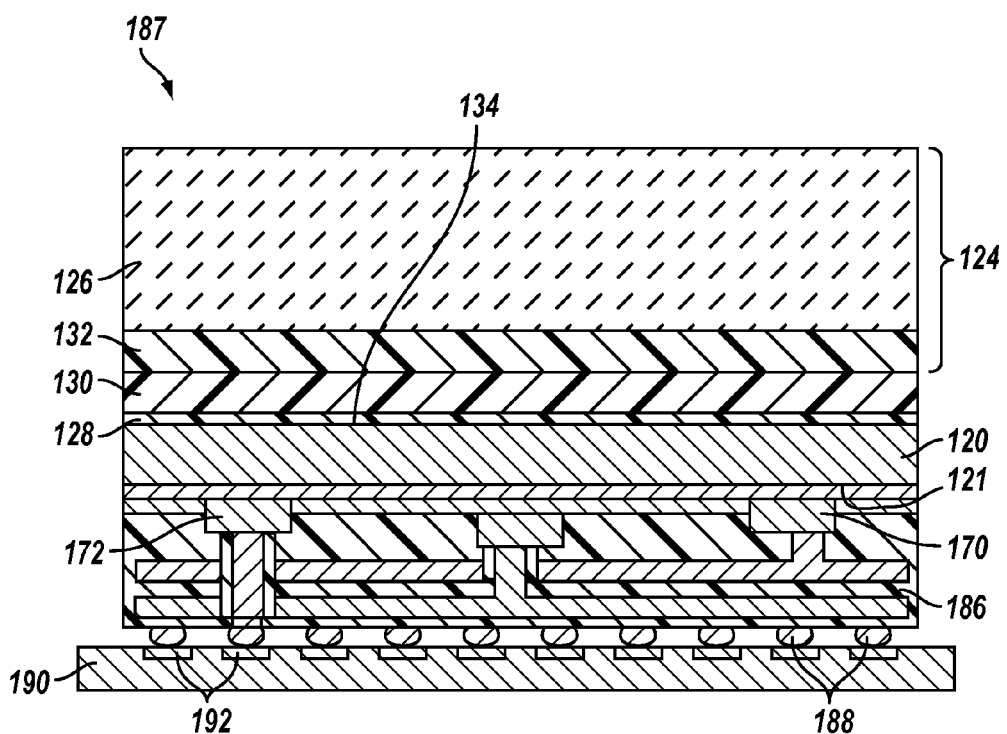
FIG. 10 is a simplified and schematically illustrated cross-sectional view illustrating the structure of FIG. 9 structurally and electrically coupled with another structure or device.

In the structure 187 of FIG. 9, the bumps or balls 188 for electrical interconnection are provided over an active surface of the structure 178 of FIG. 8, and the structure 187 is "flip-chip" bonded to the structure or device 190 (FIG. 10) with the active side of the structure 187 facing the structure or device 190. Additionally, the structure 187 may be bonded to the structure or device 190 using a so-called "ball-grid array" (BGA) defined by the bumps or balls 188. The bonding configuration shown in FIGS. 9 and 10 is provided simply as a non-limiting example of a method that may be used to structurally and electrically couple the structure 178 of FIG. 8 to another structure or device 190. Other structural and electrical bonding techniques known in the art also may be employed in additional embodiments of the disclosure. Such techniques include, but are not limited to, wire-bonding techniques, lead-over chip bonding techniques, pin-grid array bonding techniques, etc.

Figure 11:
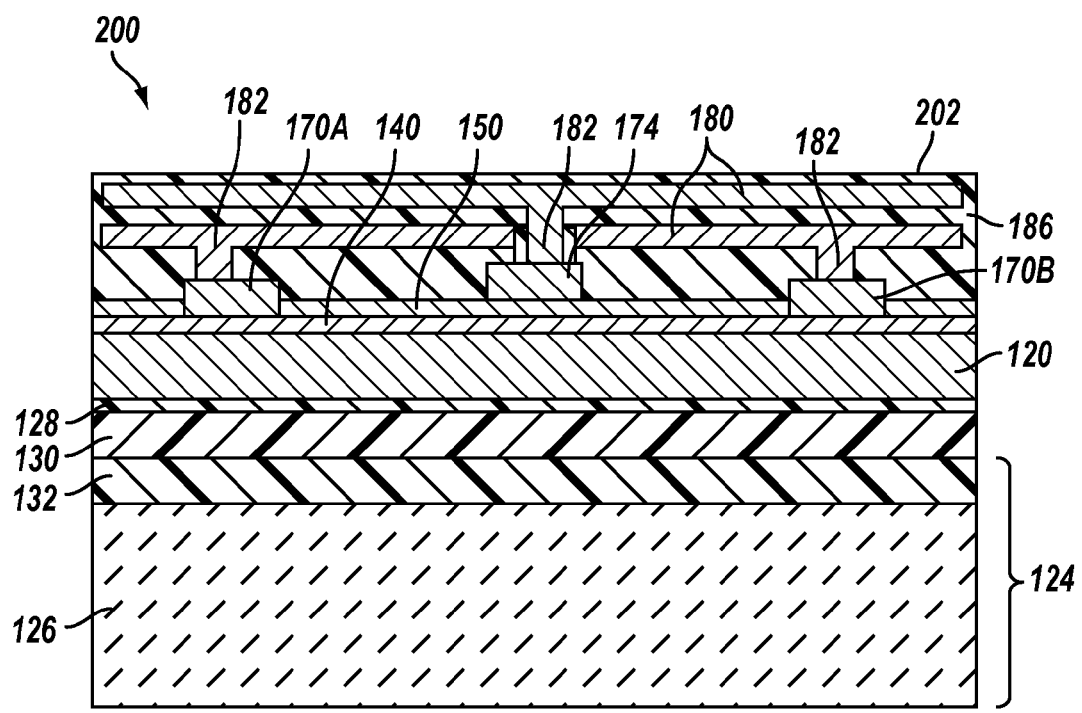
FIG. 11 is a simplified and schematically illustrated cross-sectional view illustrating another partially formed semiconductor structure similar to the structure of FIG. 8, but including two source contacts and a gate structure on one side of a III-V base layer.
Figure 12:
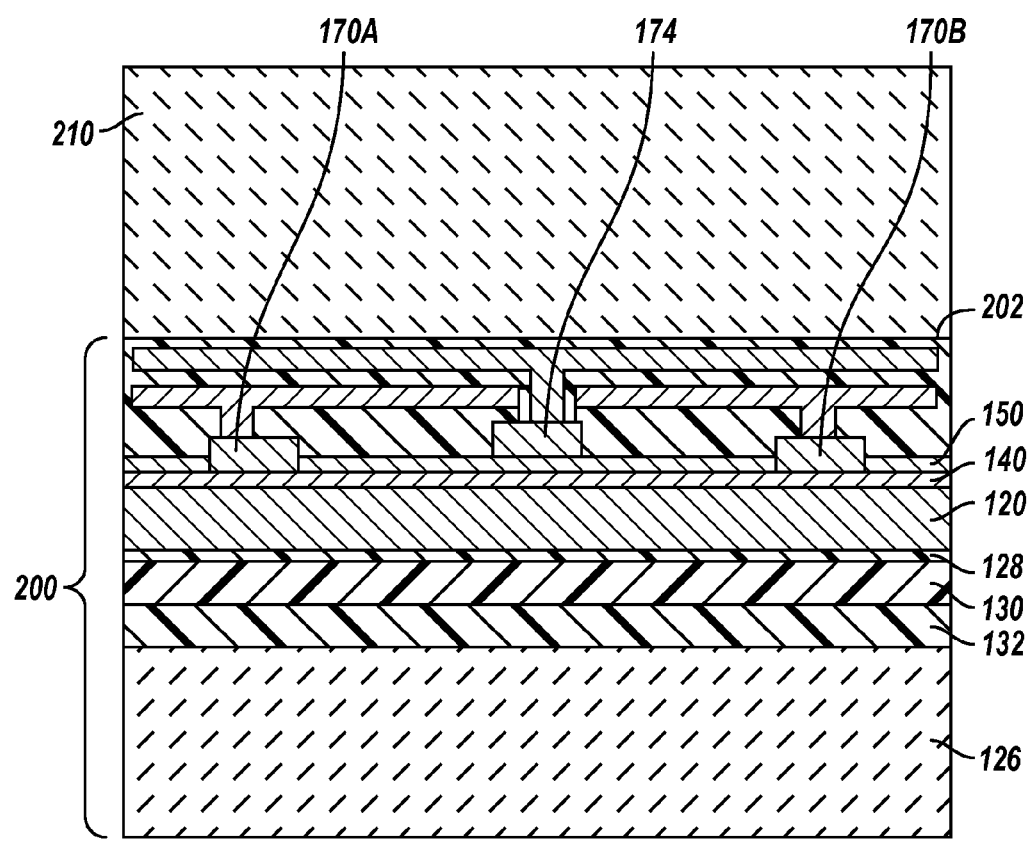
FIG. 12 is a simplified and schematically illustrated cross-sectional view illustrating a carrier substrate bonded to the structure of FIG. 11.

FIGS. 11 and 12 illustrate another embodiment in which the transistor comprises a vertical HEMT, as opposed to a lateral HEMT as described with reference to FIGS. 7 through 10.

FIG. 11 illustrates a structure 200 that is generally similar to the structure 178 of FIG. 8, except that the structure 200 includes a first source contact 170A and a second source contact 170B. The first source contact 170A and the second source contact 170B may be formed or otherwise provided proximate the heterojunction 160. Each of the source contacts 170A, 170B may be provided in electrical communication with the electron channel defined by the 2D electron gas proximate the heterojunction 160 between the first III-V device layer 140 and the second III-V device layer 150. Further, a gate structure 174 may be formed or otherwise provided proximate the electron channel defined by the 2D electron gas proximate the heterojunction 160 as previously described. The source contacts 170A, 170B and the gate structure 174 each may comprise one or more conductive materials, such as a metal (e.g., Au, Ni, Pt, Ge, Al, Cu, Ti, W, or an alloy based on such metals), or a doped semiconductor material. Each of the source contacts 170A, 170B may be formed directly over the second III-V device layer 150, and may be disposed in direct physical contact with the second III-V device layer 150. In some embodiments, each of the source contacts 170A, 170B may extend through at least a portion of the second III-V device layer 150 and may be in direct physical contact with the first III-V device layer 140, so as to ensure electrical contact with the electron channel defined by the 2D electron gas located proximate the heterojunction 160. In this configuration, the source contacts 170A, 170B are disposed laterally beside one another.

With continued reference to FIG. 11, the gate structure 174 may be formed vertically over the second III-V device layer 150 as previously described. One or more electrically conductive structures such as conductive lines 180 and conductive vias 182 may be formed over an active surface of the structure 200, in a manner like that previously described with reference to FIG. 8. After forming the source contacts 170A, 170B, the gate structure 174, and the conductive features over the active surface, a drain contact may be formed as described below with reference to FIGS. 12 through 15. Similar methods of forming a drain contact are also described in, for example, M. Sugimoto and H. Ueda et al., *Vertical device operation of AlGaN/GaN HEMTs on free-standing n-GaN substrates*, Power Conversion Conference—Nagoya, 2007 (2-5 Apr. 2007), IEEE pp. 368-372 (hereinafter "Sugimoto et al."), which is incorporated herein in its entirety by this reference.

Referring to FIG. 12, a carrier substrate 210 may optionally be temporarily bonded to an active surface 202 of the structure 200 of FIG. 11. The carrier substrate 210 may facilitate handling of the structure 200 during formation of the drain contact and subsequent processing. The carrier substrate 210 may comprise a generally planar layer of a ceramic material, a metal material, or a semiconductor material, for example. Examples of ceramic materials include oxides (e.g., silicon oxide, zirconium oxide, aluminum oxide, yttrium oxide, etc.), nitrides (aluminum nitride, silicon nitride, etc.), and carbides (e.g., silicon carbide, boron carbide, etc.). Examples of metal materials include copper, gold, nickel, aluminum, tungsten, titanium, and alloys of such materials. The metal material should exhibit a melting point high enough to remain solid during processing. Examples of semiconductor materials include silicon, germanium, a III-V semiconductor material, and mixtures of such materials. The carrier substrate 210 may be temporarily bonded to the structure 200 using, for example, an adhesive or a direct atomic bonding process.

Figure 13:
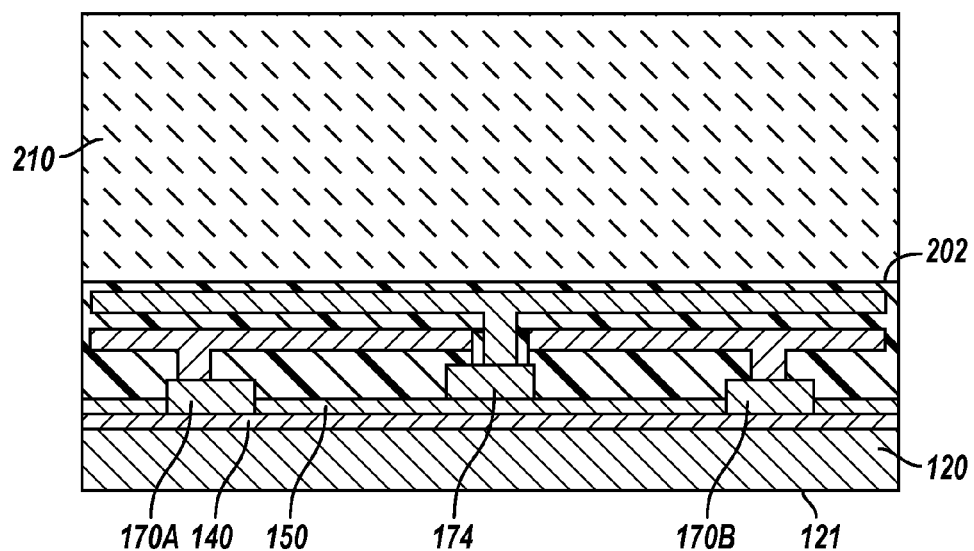
FIG. 13 is a simplified and schematically illustrated cross-sectional view illustrating a semiconductor structure formed by removing layers of material from the structure of FIG. 12 to expose a surface of a III-V base layer on a side thereof opposite the source contacts and the gate structure.

Referring to FIG. 13, the surface 121 of the III-V base layer 120 may be exposed by removing the bulk substrate material 126, the first dielectric layer 128, the second dielectric layer 130, and the third dielectric layer 132 from the structure of FIG. 12 using, for example, one or more of a grinding process, a polishing process (e.g., a chemical-mechanical polishing (CMP) process), and a selective etching process.

Figure 14:
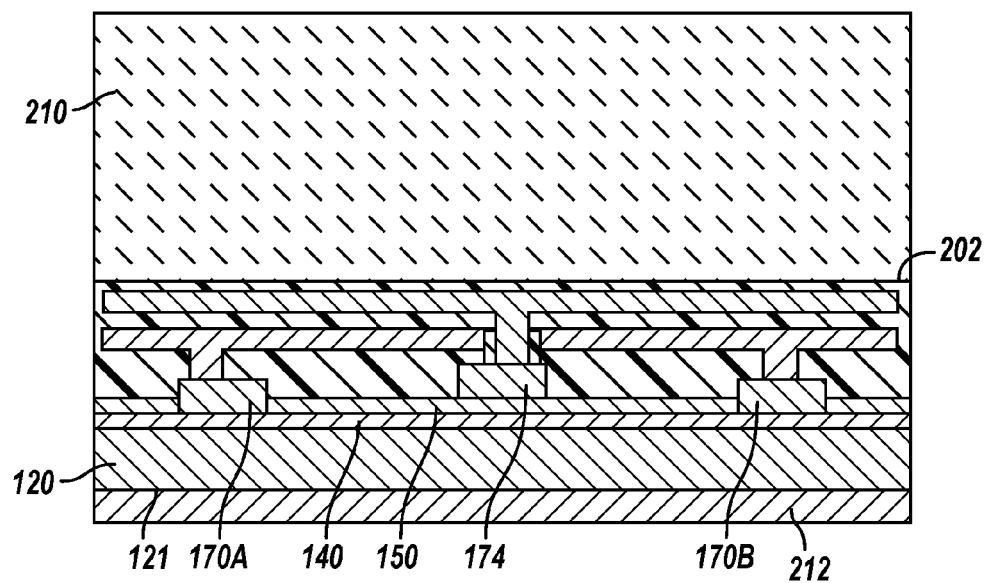
FIG. 14 is a simplified and schematically illustrated cross-sectional view illustrating a drain formed on the surface of the III-V base layer of FIG. 13 on the side of the III-V base layer opposite the source contacts and the gate structure, so as to define a vertical HEMT.

As shown in FIG. 14, a layer of conductive material may be provided over at least a portion of the surface 121 of the III-V base layer 120 to define a drain 212 of a vertical HEMT. The layer of conductive material of the drain 212 may comprise any of the electrically conductive materials previously mentioned in relation to the source contact 170, drain contact 172, and gate structure 174 with reference to FIG. 7. The layer of conductive material of the drain 212 may be deposited on the surface 121 of the III-V base layer 120 using one or more of a chemical vapor deposition (CVD) process, a physical vapor deposition (PVD) process, an evaporation process, an electroless plating process, and an electrolytic plating process.

Figure 15:
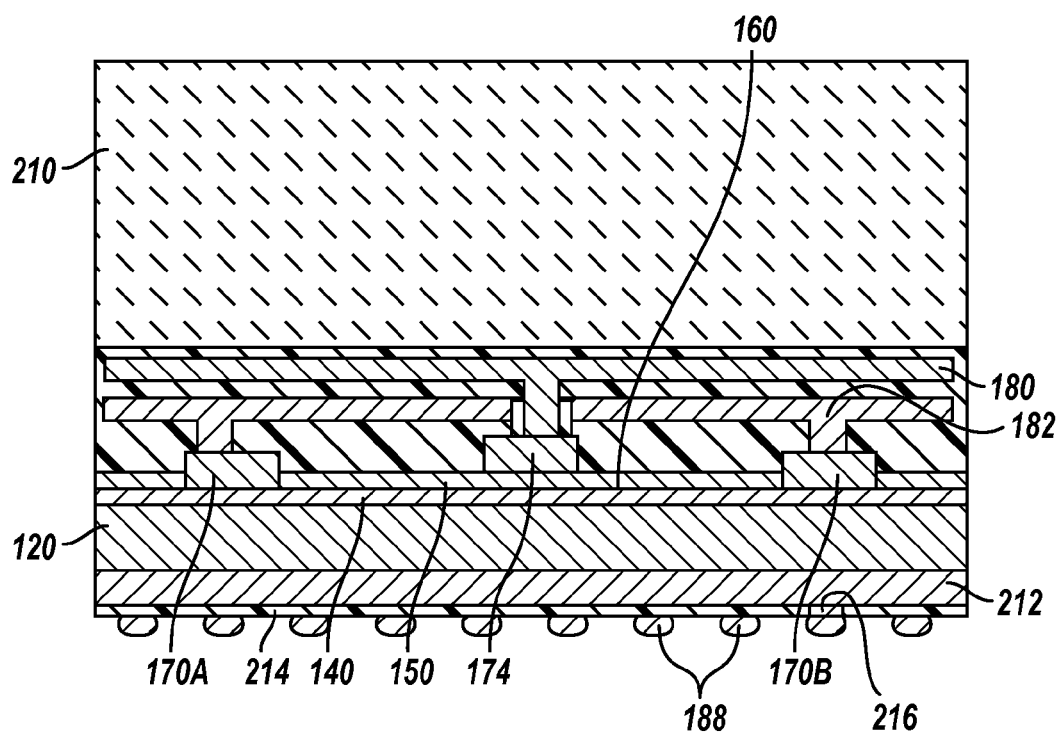
FIG. 15 is a simplified and schematically illustrated cross-sectional view illustrating electrical contacts formed on the structure of FIG. 14 for structurally and electrically coupling the structure of FIG. 14 to another structure or device.

As shown in FIG. 15, a dielectric material 214, such as an electrically insulating ceramic material (e.g., silicon oxide) may be provided over the drain 212. One or more apertures may be formed through the dielectric material 214, and a conductive via or a conductive pad 216 may be provided in the aperture to electrically interconnect the drain 212 with one or more conductive bumps or balls 188 formed over the dielectric material 212. Others of the conductive bumps or balls 188 may be electrically interconnected with respective conductive features, such as conductive lines 180 and conductive vias 182, in electrical communication with the source contacts 170A, 170B and gate structure 174, by way of electrically conductive vias (not shown) extending through, and electrically insulated from, the drain 212, the III-V base layer 120, the first III-V device layer 140, and the second III-V device layer 150.

Although the III-V base layer is illustrated as being homogenous, different regions of the III-V base layer 120 may be selectively n-doped, p-doped, and/or undoped so as to define one or more vertical electron pathways through the III-V base layer 120 between the electron channel proximate the heterojunction 160 and the drain 212. Such vertical pathways extending through the III-V base layer 120 are often referred to in the art as an "aperture." See, e.g., Sugimoto et al. After forming the structure of FIG. 15, the structure may be structurally and electrically coupled to a higher level substrate as desired, as previously described with reference to FIG. 10.

Figure 16:
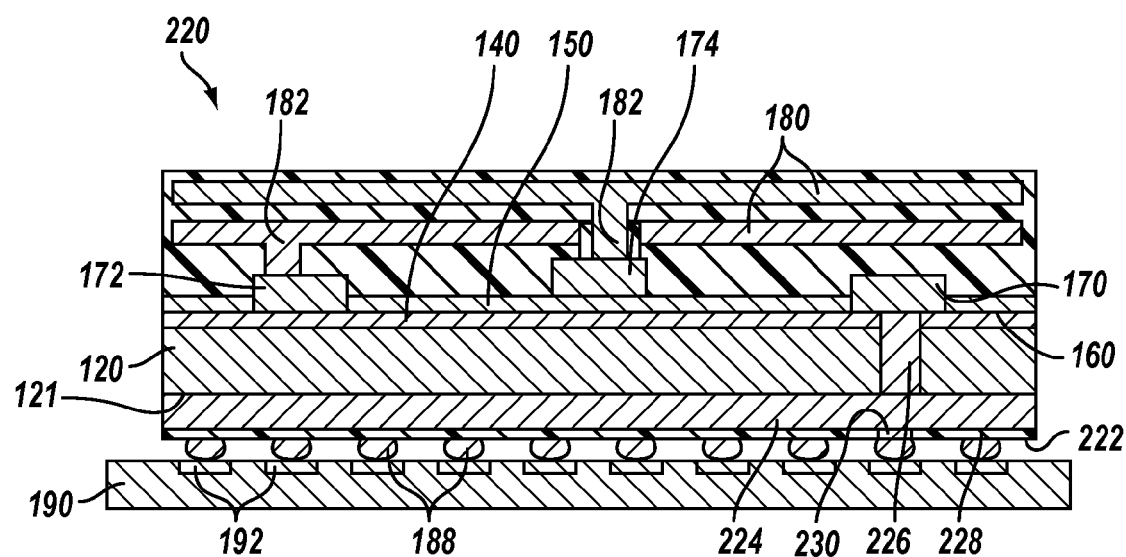
FIG. 16 is a simplified and schematically illustrated cross-sectional view illustrating another embodiment of a semiconductor structure that may be fabricated using methods as described herein, which includes a lateral HEMT including a source contact layer on a side of a III-V base layer opposite a drain contact and a gate structure of the HEMT.

FIG. 16 illustrates an additional embodiment of a semiconductor structure 220 that may be fabricated using methods as described herein. The structure of 220 is similar to the structure of FIG. 10 and includes a lateral HEMT comprising a source contact 170, a drain contact 172, and a gate structure 174 formed as previously described with reference to FIG. 7. The structure 220 of FIG. 16, however, is not flip-chip bonded to a higher level structure or device 190, but instead has a back side 222 that faces and may be structurally and electrically coupled to another structure or device 190. In addition, the source contacts 170 of FIG. 16 may not be electrically connected to the conductive lines 180 by the conductive vias 182. The lateral HEMT of FIG. 16 may be similar to the lateral substrate-drive HEMT (SD-HEMT) described in M. Sadaka and S. Chandrasekaran et al., *Novel GaAs Switch for Compact and Efficient Power Conversion*, CS MANTECH Conference, April 14-17, Chicago, Ill. (2008), which is incorporated herein in its entirety by this reference. As shown in FIG. 16, a source contact layer 224 comprising a layer of electrically conductive material may be deposited or otherwise provided over surface 121 of the III-V bulk layer 120. The bulk substrate material 126, the first dielectric layer 128, the second dielectric layer 130, and the third dielectric layer 132 (FIG. 12) may be removed from the surface 121 of the III-V base layer 120 as previously described with reference to FIG. 13, after which the source contact layer 224 may be provided on the surface 121 of the III-V base layer 120. The source contact layer 224 may comprise any of the electrically conductive materials previously mentioned in relation to the source contact 170, drain contact 172, and gate structure 174 with reference to FIG. 7. The source contact layer 224 may be deposited on the surface 121 of the III-V base layer 120 using one or more of a chemical vapor deposition (CVD) process, a physical vapor deposition (PVD) process, an electroless plating process, and an electrolytic plating process, for example.

The source contact 170 may include a conductive via or trench 226 that extends through the III-V base layer 120 between the electron channel proximate the heterojunction 160 and the source contact layer 224. The conductive via or trench 226 may comprise any of the electrically conductive materials previously mentioned in relation to the source contact 170, drain contact 172, and gate structure 174 with reference to FIG. 7, and may be formed by forming a via or aperture through the III-V base layer using an etching process, and subsequently depositing conductive material within the via or aperture using one or more of a chemical vapor deposition (CVD) process, a physical vapor deposition (PVD) process, an electroless plating process, and an electrolytic plating process. In some embodiments, the conductive via or trench 226 optionally may be at least partially surrounded by an electrically insulating material or area, such as a dielectric material or a doped p-type area of the III-V base layer 120, for example.

As shown in FIG. 16, a dielectric material 228, such as an electrically insulating ceramic material (e.g., silicon oxide) may be provided over the source contact layer 224. One or more apertures may be formed through the dielectric material 228, and a conductive via or a conductive pad 230 may be provided in the aperture to electrically interconnect the source contact layer 224 with one or more conductive bumps or balls 188 formed over the dielectric material 228. Others of the conductive bumps or balls 188 may be electrically interconnected with respective conductive features, such as conductive lines 180 and conductive vias 182, in electrical communication with the drain contact 172 and the gate structure 174, by way of electrically conductive vias (not shown) extending through, and electrically insulated from, the source contact layer 224, the III-V base layer 120, the first III-V device layer 140, and the second III-V device layer 150.

As previously stated, in any of embodiments disclosed herein, including that of FIG. 16, although the III-V base layer 120 is illustrated as being homogenous, different regions of the III-V base layer 120 may be selectively n-doped, p-doped, and/or undoped so as to define conductive and non-conductive regions within the III-V base layer 120.

Figure 17:
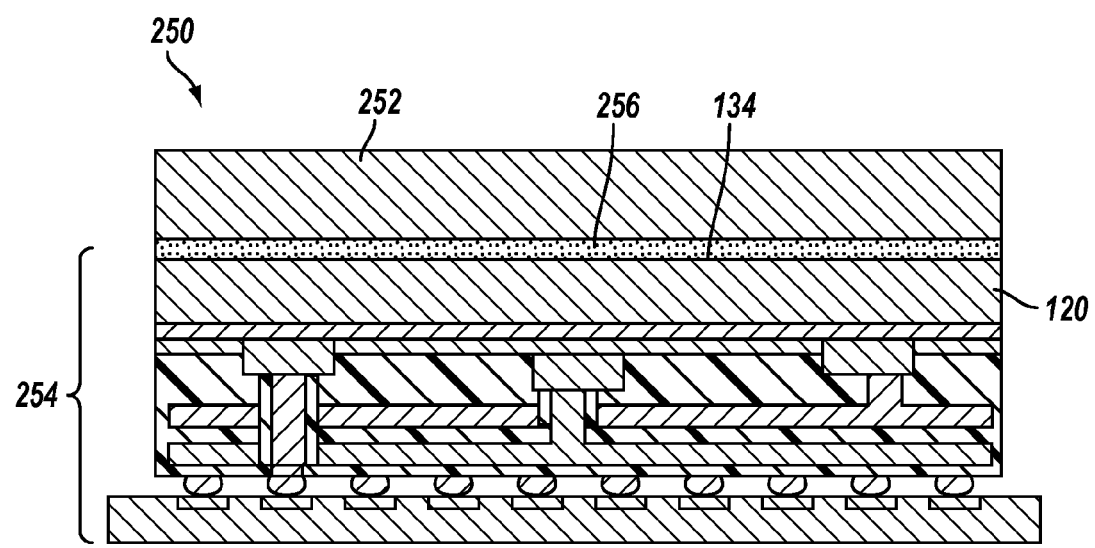
FIG. 17 is a simplified and schematically illustrated cross-sectional view illustrating another embodiment of a semiconductor structure that may be fabricated using methods as described herein, which semiconductor structure includes a heat sink structure bonded to a III-V base layer on which an HEMT has been fabricated.

Optionally, a heat sink structure may be bonded to any of the semiconductor structures previously described herein to facilitate cooling of the semiconductor structures during operation. As a non-limiting example, FIG. 17 illustrates a semiconductor structure 250 that includes a heat sink structure 252 bonded to a structure 254 that is similar to the structure of FIG. 10, but wherein the second substrate 124 (FIG. 10) has been removed from the surface 134 of the III-V base layer 120. The heat sink structure 252 may comprise a thermally conductive material, such as a metal or metal alloy. The heat sink structure 252 may be bonded to the surface 134 of the III-V base layer 120 using, for example, a thermally conductive adhesive 256 or a metal-to-metal direct bonding process. For example, a metal layer (e.g., a layer of copper, tungsten, or silver) may be deposited on the surface 134 of the III-V base layer 120. Another metal layer (e.g., a layer of copper or tungsten) also may be deposited on the heat sink structure 252, if needed. The metal layer on the heat sink structure 252 then may be directly atomically bonded to the metal layer of the III-V base layer 120 using a metal-to-metal direct bonding process, as previously described with reference to FIG. 3.

Such a heat sink structure 252 may be applied to any of the other semiconductor structures described herein.

Additional non-limiting example embodiments of the present disclosure are set forth below.

Embodiment 1

A method of forming a semiconductor device, comprising: epitaxially growing a III-V base layer over a surface of a first substrate in a first deposition chamber; transferring the III-V base layer from the surface of the first substrate to a surface of a second substrate; and epitaxially growing at least one III-V device layer on an exposed surface of the III-V base layer in a second deposition chamber separate from the first deposition chamber while the III-V base layer is disposed on the second substrate; wherein the first substrate exhibits an average coefficient of thermal expansion (CTE) closer to an average CTE exhibited by the III-V base layer than an average CTE exhibited by the second substrate.

Embodiment 2

The method of Embodiment 1, wherein epitaxially growing the at least one III-V device layer on the exposed surface of the III-V base layer comprises: growing a first III-V device layer on the exposed surface of the III-V base layer in the second deposition chamber, the first III-V device layer having first material composition; and growing a second III-V device layer on the first III-V device layer in the second deposition chamber, the second III-V device layer having a second material composition differing from the first material composition so as to define an electron channel of at least one transistor proximate a heterojunction between the first III-V device layer and the second III-V device layer.

Embodiment 3

The method of Embodiment 2, further comprising: providing a source contact and a drain contact of the at least one transistor in electrical communication with the electron channel defined proximate the heterojunction between the first III-V device layer and the second III-V device layer; and providing a gate structure of the at least one transistor proximate the electron channel between the source contact and the drain contact.

Embodiment 4

The method of Embodiment 3, wherein providing the source contact and the drain contact of the at least one transistor in electrical communication with the electron channel defined proximate the heterojunction between the first III-V device layer and the second III-V device layer comprises: forming the source contact vertically over the second III-V device layer and in direct physical contact with the second III-V device layer; and forming the drain contact vertically over the second III-V device layer and in direct physical contact with the second III-V device layer.

Embodiment 5

The method of Embodiment 3, wherein providing the source contact and the drain contact of the at least one transistor in electrical communication with the electron channel defined proximate the heterojunction between the first III-V device layer and the second III-V device layer comprises: providing an electrically conductive structure on a side of the III-V base layer opposite the first III-V device layer; and establishing electrical contact between at least one of the source contact and the drain contact of the at least one transistor and the electrically conductive structure through an electrical pathway extending through the III-V base layer.

Embodiment 6

The method of any one of Embodiments 3 through 5, wherein providing the gate structure of the at least one transistor proximate the electron channel between the source contact and the drain contact comprises forming the gate structure vertically over the second III-V device layer.

Embodiment 7

The method of any one of Embodiments 2 through 6, further comprising configuring the at least one transistor to comprise a high electron mobility transistor.

Embodiment 8

The method of Embodiment 7, wherein configuring the at least one transistor to comprise a high electron mobility transistor comprises configuring the at least one transistor to comprise a pseudomorphic high electron mobility transistor.

Embodiment 9

The method of any one of Embodiments 2 through 8, wherein epitaxially growing the III-V base layer over the surface of the first substrate comprises epitaxially growing a III-nitride material over the surface of the first substrate.

Embodiment 10

The method of Embodiment 9, wherein growing the first III-V device layer on the exposed surface of the III-V base layer comprises epitaxially growing a ternary III-V semiconductor material on an exposed surface of the III-nitride material grown over the surface of the first substrate.

Embodiment 11

The method of Embodiment 10, wherein growing the second III-V device layer on the first III-V device layer comprises epitaxially growing a binary III-V semiconductor material on a surface of the ternary III-V semiconductor material.

Embodiment 12

The method of any one of Embodiments 2 through 11, wherein epitaxially growing the III-V base layer over the surface of the first substrate comprises epitaxially growing a polar III-V semiconductor material over the surface of the first substrate, and wherein growing the first III-V device layer on the exposed surface of the III-V base layer comprises growing the first III-V device layer on a Group V face of the polar III-V semiconductor material.

Embodiment 13

The method of any one of Embodiments 2 through 12, further comprising: selecting the III-V base layer to comprise a first binary III-V semiconductor material selected from the group consisting of AlN, AlP, AlAs, GaN, GaP, GaAs, InN, InP, and InAs; selecting the first III-V device layer to comprise a ternary III-V semiconductor material selected from the group consisting of AlGaN, InGaN, AlInN, AlGaP, GaInP, AlInP, AlGaAs, GaInAs, and AlInAs; and selecting the second III-V device layer to comprise a second binary III-V semiconductor material selected from the group consisting of AlN, AlP, AlAs, GaN, GaP, GaAs, InN, InP, and InAs.

Embodiment 14

The method of Embodiment 13, further comprising: selecting the first binary III-V semiconductor material to comprise GaN; selecting the ternary III-V semiconductor material to comprise AlGaN; and selecting the second binary III-V semiconductor material to comprise GaN.

Embodiment 15

The method of any one of Embodiments 2 through 14, further comprising: selecting the first material composition of the first III-V device layer to exhibit a first energy bandgap; and selecting the second material composition of the second III-V device layer to exhibit a second energy bandgap differing from the first energy bandgap, a conduction band in an energy band structure within the first III-V device layer and the second III-V device layer extending below a Fermi energy level proximate the heterojunction such that a two-dimensional electron gas is defined in at least one of the first III-V device layer and the second III-V device layer proximate the heterojunction.

Embodiment 16

The method of Embodiment 15, wherein the two-dimensional electron gas is defined in the second III-V device layer adjacent the heterojunction.

Embodiment 17

The method of any one of Embodiments 1 through 16, further comprising: selecting the first substrate to comprise a first substrate material exhibiting a first average CTE; and selecting the III-V base layer to comprise a III-V semiconductor material exhibiting a second average CTE, the second average CTE being within about 20% or less of the first average CTE.

Embodiment 18

The method of any one of Embodiments 1 through 18, further comprising selecting the first substrate material to comprise metallic molybdenum or a metallic molybdenum alloy.

Embodiment 19

The method of any one of Embodiments 1 through 18, further comprising selecting the III-V base layer to comprise GaN.

Embodiment 20

The method of Embodiment 17, further comprising selecting the second substrate to comprise a second substrate material exhibiting a third average CTE differing from the first average CTE.

Embodiment 21

The method of any one of Embodiments 1 through 20, further comprising selecting the second substrate material to comprise silicon.

Embodiment 22

A semiconductor device, comprising: a substrate including a bulk substrate material comprising silicon; a III-V base layer disposed over the substrate; a first III-V device layer on a surface of the III-V base layer opposite the substrate, the first III-V device layer having first material composition; and a second III-V device layer on a surface of the first III-V device layer opposite the III-V base layer, the second III-V device layer having a second material composition differing from the first material composition so as to define an electron channel of at least one transistor proximate a heterojunction between the first III-V device layer and the second III-V device layer.

Embodiment 23

The semiconductor device of Embodiment 22, further comprising: a source contact and a drain contact of the at least one transistor in electrical communication with the electron channel defined proximate the heterojunction between the first III-V device layer and the second III-V device layer; and a gate structure of the at least one transistor proximate the electron channel between the source contact and the drain contact.

Embodiment 24

The semiconductor device of Embodiment 23, wherein the source contact is disposed vertically over the second III-V device layer and in direct physical contact with the second III-V device layer, and the drain contact is disposed vertically over the second III-V device layer and in direct physical contact with the second III-V device layer.

Embodiment 25

The semiconductor device of Embodiment 23, further comprising an electrically conductive structure on a side of the III-V base layer opposite the first III-V device layer, the electrically conductive structure in electrical contact with at least one of the source contact and the drain contact of the at least one transistor through an electrical pathway extending through the III-V base layer.

Embodiment 26

The semiconductor device of any one of Embodiments 23 through 25, wherein the gate structure is disposed vertically over the second III-V device layer.

Embodiment 27

The semiconductor device of any one of Embodiments 23 through 26, wherein the at least one transistor comprises a high electron mobility transistor.

Embodiment 28

The semiconductor device of Embodiment 27, wherein the high electron mobility transistor comprises a pseudomorphic high electron mobility transistor.

Embodiment 29

The semiconductor device of any one of Embodiments 22 through 28, wherein the III-V base layer comprises a III-nitride material.

Embodiment 30

The semiconductor device of any one of Embodiments 22 through 29, wherein the first III-V device layer comprises a ternary III-V semiconductor material.

Embodiment 31

The semiconductor device of any one of Embodiments 22 through 30, wherein the second III-V device layer comprises a binary III-V semiconductor material.

Embodiment 32

The semiconductor device of any one of Embodiments 22 through 32, wherein the III-V base layer comprises a polar III-V semiconductor material, and wherein the first III-V device layer is disposed on a Group V face of the polar III-V semiconductor material.

Embodiment 33

The semiconductor device of any one of Embodiments 22 through 32, wherein: the III-V base layer comprises a first binary III-V semiconductor material selected from the group consisting of AlN, AlP, AlAs, GaN, GaP, GaAs, InN, InP, and InAs; the first III-V device layer comprises a ternary III-V semiconductor material selected from the group consisting of AlGaN, InGaN, AlInN, AlGaP, GaInP, AlInP, AlGaAs, GaInAs, and AlInAs; and the second III-V device layer comprises a second binary III-V semiconductor material selected from the group consisting of AlN, AlP, AlAs, GaN, GaP, GaAs, InN, InP, and InAs.

Embodiment 34

The semiconductor device of Embodiment 33, wherein: the first binary III-V semiconductor material comprises GaN; the ternary III-V semiconductor material comprises AlGaN; and the second binary III-V semiconductor material comprises GaN.

Embodiment 35

The semiconductor device of any one of Embodiments 22 through 34, wherein: the first material composition of the first III-V device layer exhibits a first energy bandgap; and the second material composition of the second III-V device layer exhibits a second energy bandgap differing from the first energy bandgap, a conduction band in an energy band structure within the first III-V device layer and the second III-V device layer extending below a Fermi energy level proximate the heterojunction such that a two-dimensional electron gas is defined in at least one of the first III-V device layer and the second III-V device layer proximate the heterojunction.

Embodiment 36

The semiconductor device of Embodiment 35, wherein the two-dimensional electron gas is disposed in the second III-V device layer adjacent the heterojunction.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternate useful combinations of the elements described, will become apparent to those skilled in the art from the description. Such modifications and embodiments are also intended to fall within the scope of the appended claims.

What is claimed is:

1. A method of forming a semiconductor device, comprising:
    epitaxially growing a III-V base layer over a surface of a first substrate in a first deposition chamber, the first substrate comprising metallic molybdenum or a metallic molybdenum alloy, the first substrate exhibiting a first average CTE, the III-V base layer comprising a III-V semiconductor material exhibiting a second average CTE within about 10% or less of the first average CTE;
    transferring the III-V base layer from the surface of the first substrate to a surface of a second substrate;
    after transferring the III-V base layer to the second substrate, epitaxially growing a first III-V device layer and on an exposed surface of the III-V base layer in a second deposition chamber separate from the first deposition chamber, and epitaxially growing a second III-V device layer on the first III-V device layer in the second deposition chamber while the III-V base layer is disposed on the second substrate, the first III-V device layer having first material composition, the second III-V device layer having a second material composition differing from the first material composition so as to define an electron channel of at least one transistor proximate a heterojunction between the first III-V device layer and the second III-V device layer;
    providing a first source contact and a second source contact of the at least one transistor in electrical contact with the second III-V device layer and in electrical communication with the electron channel;
    providing a gate structure of the at least one transistor proximate the electron channel between the first source contact and the second source contact;
    temporarily bonding a carrier substrate over the first source contact, the second source contact, and the gate structure;
    removing second substrate from the III-V base layer and exposing a surface of the III-V base layer;
    providing a layer of conductive material over at least a portion of the exposed surface of the III-V base layer, the layer of conductive material defining a drain contact of the at least one transistor; and
    providing a dielectric material over the drain contact on a side thereof opposite the III-V base layer;
    wherein the at least one transistor comprises a vertical high electron mobility transistor.

2. The method of claim 1, further comprising configuring the at least one transistor to comprise a pseudomorphic high electron mobility transistor.

3. The method of claim 1, wherein epitaxially growing the III-V base layer over the surface of the first substrate comprises epitaxially growing a polar III-V semiconductor material over the surface of the first substrate, and wherein growing the first III-V device layer on the exposed surface of the III-V base layer comprises growing the first III-V device layer on a Group V face of the polar III-V semiconductor material.

4. The method of claim 1, further comprising:
    selecting the III-V base layer to comprise a first binary III-V semiconductor material and selecting the first binary III-V semiconductor material to comprise GaN;
    selecting the first III-V device layer to comprise a ternary III-V semiconductor material and selecting the ternary III-V semiconductor material to comprise AlGaN; and
    selecting the second III-V device layer to comprise a second binary III-V semiconductor material and selecting the second binary III-V semiconductor material to comprise GaN.

5. The method of claim 1, further comprising:
    selecting the first material composition of the first III-V device layer to exhibit a first energy bandgap; and
    selecting the second material composition of the second III-V device layer to exhibit a second energy bandgap differing from the first energy bandgap, a conduction band in an energy band structure within the first III-V device layer and the second III-V device layer extending below a Fermi energy level proximate the heterojunction such that a two-dimensional electron gas is defined in at least one of the first III-V device layer and the second III-V device layer proximate the heterojunction.

6. The method of claim 1, further comprising selecting the second substrate to comprise a second substrate material exhibiting a third average CTE differing from the first average CTE.

7. The method of claim 6, further comprising selecting the second substrate material to comprise silicon.

* * * * *

UNITED STATES PATENT AND TRADEMARK OFFICE
CERTIFICATE OF CORRECTION

PATENT NO. : 9,716,164 B2  
APPLICATION NO. : 14/430513  
DATED : July 25, 2017  
INVENTOR(S) : Mariam Sadaka Page 1 of 1

It is certified that error appears in the above-identified patent and that said Letters Patent is hereby corrected as shown below:

In the Specification  
Column 10, Line 49, change "in one HYPE" to --in one HVPE--  
Column 10, Line 53, change "separate HYPE or" to --separate HVPE or--

Signed and Sealed this  
Eighth Day of May, 2018

Andrei Iancu  
*Director of the United States Patent and Trademark Office*